(12) United States Patent
Isaak

(10) Patent No.: US 6,544,815 B2
(45) Date of Patent: Apr. 8, 2003

(54) PANEL STACKING OF BGA DEVICES TO FORM THREE-DIMENSIONAL MODULES

(76) Inventor: Harlan R. Isaak, 2870 Chios Rd., Costa Mesa, CA (US) 92626

(*) Notice: Subject to any disclaimer, the term of this patent is extended or adjusted under 35 U.S.C. 154(b) by 0 days.

(21) Appl. No.: 09/922,977

(22) Filed: Aug. 6, 2001

(65) Prior Publication Data

US 2001/0054770 A1 Dec. 27, 2001

Related U.S. Application Data

(62) Division of application No. 09/598,343, filed on Jun. 21, 2000.

(51) Int. Cl.[7] .............................. H01L 21/44
(52) U.S. Cl. ................. 438/109; 438/107; 438/108; 257/686; 257/777; 257/778
(58) Field of Search .................... 438/109, 108, 438/106, 107; 257/685, 686, 777, 723, 778, 678, 781, 786, 687; 361/764, 783, 829, 790

(56) References Cited

U.S. PATENT DOCUMENTS

| | | | |
|---|---|---|---|
| 3,723,977 A | 3/1973 | Schaufele | 365/116 |
| 3,746,934 A | 7/1973 | Stein | 361/810 |
| 4,851,695 A | 7/1989 | Stein | 250/551 |
| 4,956,694 A | 9/1990 | Eide | 257/686 |
| 5,128,831 A | 7/1992 | Fox, III et al. | 361/396 |
| 5,198,888 A | 3/1993 | Sugano et al. | 257/686 |
| 5,201,451 A | 4/1993 | Desai et al. | 228/5.5 |
| 5,231,304 A | 7/1993 | Solomon | 257/684 |
| 5,239,447 A | 8/1993 | Cotues et al. | 361/744 |
| 5,269,453 A | 12/1993 | Melton et al. | 228/180.22 |
| 5,282,565 A | 2/1994 | Melton | 228/180.22 |
| 5,284,796 A | 2/1994 | Nakanishi et al. | 438/108 |
| 5,311,401 A | 5/1994 | Gates, Jr. et al. | 361/760 |
| 5,313,096 A | 5/1994 | Eide | 257/686 |
| 5,324,569 A | 6/1994 | Nagesh et al. | 228/175 |
| 5,328,087 A | 7/1994 | Nelson et al. | 228/175 |
| 5,373,189 A | 12/1994 | Massit et al. | 257/686 |
| 5,384,689 A | 1/1995 | Shen | 361/767 |
| 5,435,482 A * | 7/1995 | Variot et al. | 228/254 |
| 5,514,907 A | 5/1996 | Moshayedi | 257/723 |

(List continued on next page.)

FOREIGN PATENT DOCUMENTS

| | | |
|---|---|---|
| JP | 60194548 | 10/1985 |
| JP | 2239651 | 2/1990 |
| JP | 4209562 | 7/1992 |
| JP | 677644 | 3/1994 |

OTHER PUBLICATIONS

Anonymous, Organic Card Device Carrier, Research Disclosure, May 1990, No. 313 (previously sent).

Primary Examiner—Amir Zarabian
Assistant Examiner—Jeff Vockrodt
(74) Attorney, Agent, or Firm—Stetina Brunda Garred & Brucker

(57) ABSTRACT

A chip stack comprising at least two base layers, each of which includes a base substrate and a first conductive pattern disposed on the base substrate. The chip stack further comprises at least one interconnect frame having a second conductive pattern disposed thereon. The interconnect frame is disposed between the base layers, with the second conductive pattern being electrically connected to the first conductive pattern of each of the base layers. Also included in the chip stack are at least two integrated circuit chips which are electrically connected to respective ones of the first conductive patterns. One of the integrated circuit chips is at least partially circumvented by the interconnect frame and at least partially covered by one of the base layers. The chip stack further comprises a transposer layer comprising a transposer substrate having a third conductive pattern disposed thereon. The first conductive pattern of one of the base layers is electrically connected to the third conductive pattern of the transposer layer.

8 Claims, 2 Drawing Sheets

U.S. PATENT DOCUMENTS

| | | | |
|---|---|---|---|
| 5,544,017 A | * 8/1996 | Beilin et al. | 361/790 |
| 5,607,538 A | 3/1997 | Cooke | 156/291 |
| 5,612,570 A | 3/1997 | Eide et al. | 257/686 |
| 5,700,715 A | 12/1997 | Pasch | 438/613 |
| 5,712,767 A | 1/1998 | Koizumi | 361/761 |
| 5,731,633 A | 3/1998 | Clayton | 257/723 |
| 5,759,046 A | 6/1998 | Ingraham et al. | 439/42 |
| 5,818,106 A | 10/1998 | Kunimatsu | 257/703 |
| 5,869,353 A | 2/1999 | Levy et al. | 438/109 |
| 5,869,896 A | 2/1999 | Baker et al. | 257/724 |
| 5,930,603 A | 7/1999 | Tsuji et al. | 438/127 |
| 5,950,304 A | 9/1999 | Khandros et al. | 29/831 |
| 6,057,381 A | 5/2000 | Ma et al. | 522/99 |
| 6,313,522 B1 | * 11/2001 | Akram et al. | 257/686 |

* cited by examiner

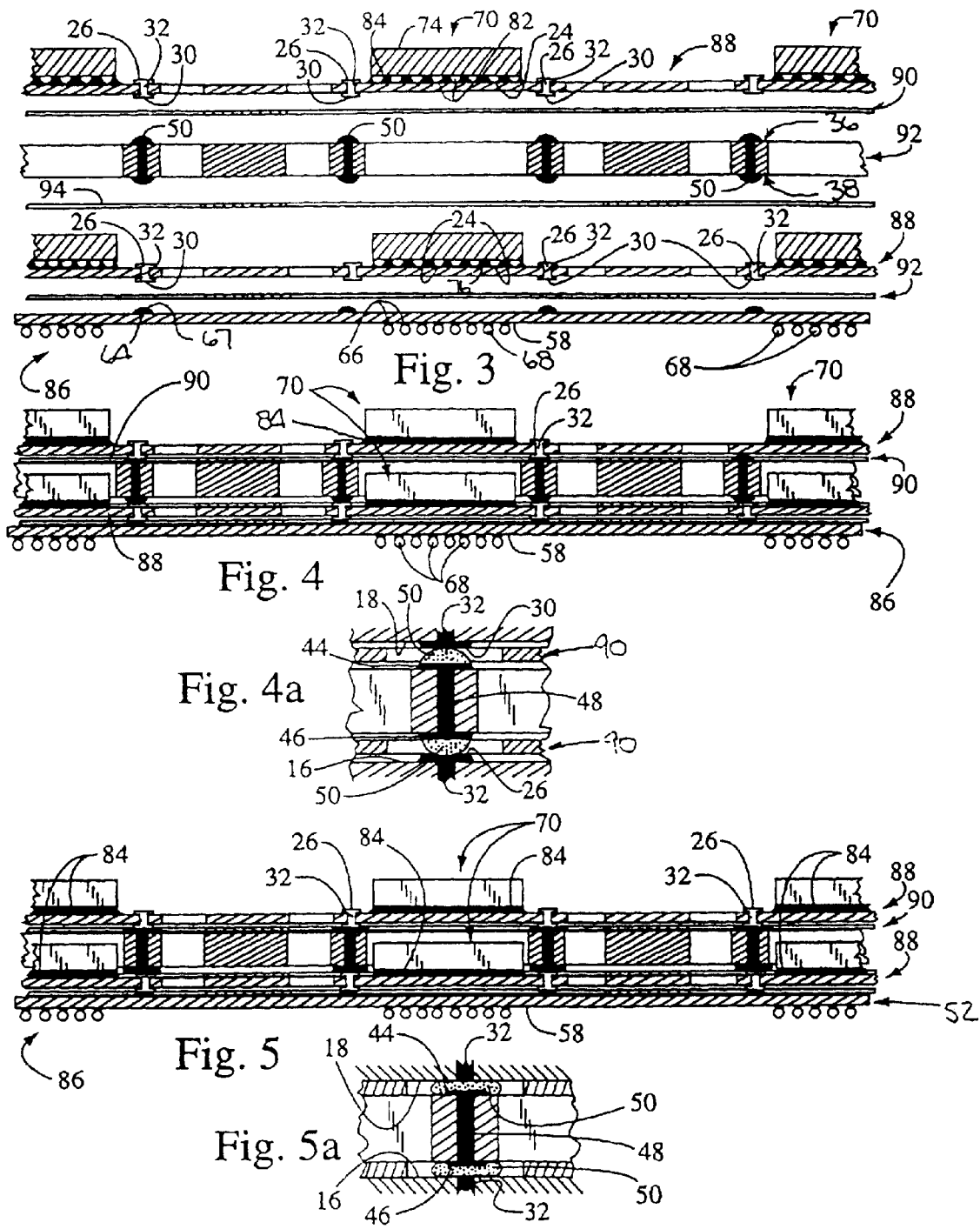

PANEL STACKING OF BGA DEVICES TO FORM THREE-DIMENSIONAL MODULES

This is a division of application No. 09/598,343, filed Jun. 21, 2000.

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to chip stacks, and more particularly to a chip stack having connections routed from the bottom to the perimeter thereof to allow multiple integrated circuit chips such as BGA devices to be quickly, easily and inexpensively vertically interconnected in a volumetrically efficient manner.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. Nos. 4,956,694 entitled INTEGRATED CIRCUIT CHIP STACKING issued Sep. 11, 1990, 5,612,570 entitled CHIP STACK AND METHOD OF MAKING SAME issued Mar. 18, 1997, and 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a volumetrically efficient chip stack. In the chip stack of the present invention, connections are routed from the bottom of the chip stack to the perimeter thereof so that interconnections can be made vertically which allows multiple integrated circuit chips such as BGA, CSP, fine pitch BGA, or flip chip devices to be stacked in a manner providing the potential for significant increases in the production rate of the chip stack and resultant reductions in the cost thereof.

BRIEF SUMMARY OF THE INVENTION

In accordance with the present invention, there is provided a chip stack comprising at least two base layers (i.e., an upper base.layer and a lower base layer). Each of the base layers includes a base substrate having a first conductive pattern disposed thereon. The chip stack further comprises at least one interconnect frame having a second conductive pattern disposed thereon. The interconnect frame is disposed between the upper and lower base layers, with the second conductive pattern being electrically connected to the first conductive pattern of each of the base layers. In addition to the base layers and interconnect frame, the chip stack comprises at least two integrated circuit chips which are electrically connected to respective ones of the first conductive patterns. The integrated circuit chip electrically connected to the first conductive pattern of the lower base layer is at least partially circumvented by the interconnect frame and at least partially covered by the upper base layer. The chip stack further preferably comprises a transposer layer which includes a transposer substrate having a third conductive pattern disposed thereon. The first conductive pattern of the lower base layer is electrically connected to the third conductive pattern of the transposer layer.

In the present chip stack, the base substrate of each of the base layers defines opposed, generally planar top and bottom surfaces. The first conductive pattern itself comprises first and second sets of base pads which are disposed on the top surface of the base substrate, with the base pads of the second set being electrically connected to respective ones of the base pads of the first set via conductive traces. In addition to the first and second sets of base pads, the first conductive pattern includes a third set of base pads disposed on the bottom surface of the base substrate and electrically connected to respective ones of the base pads of the second set. More particularly, each of the base pads of the second set is preferably electrically connected to a respective one of the base pads of the third set via a base feed-through hole. The base feed-through hole is preferably plugged with a conductive material selected from the group consisting of nickel, gold, tin, silver epoxy, and combinations thereof. The integrated circuit chips are disposed upon respective ones of the top surfaces of the base substrates and electrically connected to at least some of the base pads of respective ones of the first sets. Additionally, the base pads of the second set of the lower base layer are electrically connected to the second conductive pattern of the interconnect frame, as are the base pads of the third set of the upper base layer.

The interconnect frame of the chip stack itself defines opposed, generally planar top and bottom surfaces, with the second conductive pattern comprising first and second sets of frame pads disposed on respective ones of the top and bottom surfaces. Each of the frame pads of the first set is electrically connected to a respective one of the frame pads of the second set via a frame feed-through hole which is also plugged with a conductive material preferably selected from the group consisting of nickel, gold, tin, silver epoxy, and combinations thereof. The interconnect frame is preferably disposed between the upper and lower base layers such that the frame pads of the second set are electrically connected to respective ones of the base pads of the second set of the lower base layer, with the frame pads of the first set being electrically connected to respective ones of the base pads of the third set of the upper base layer.

The transposer substrate of the present chip stack also defines opposed, generally planar top and bottom surfaces, with the third conductive pattern comprising first and second sets of transposer pads disposed on respective ones of the top and bottom surface of the transposer substrate. The transposer pads of the first set are electrically connected to respective ones of the transposer pads of the second set. Additionally, the base pads of the third set of the lower base layer are electrically connected to respective ones of the transposer pads of the first set.

In the present chip stack, the transposer pads of the first set, the frame pads of the first and second sets, and the base pads of the second and third sets are preferably arranged identical patterns. Additionally, the transposer and base substrates each preferably have a generally rectangular configuration defining opposed pairs of longitudinal and lateral peripheral edge segments. The interconnect frame itself preferably has a generally rectangular configuration defining opposed pairs of longitudinal and lateral side sections. The transposer pads of the first set extend along the longitudinal and lateral peripheral edge segments of the transposer substrate. Similarly, the first and second sets of frame pads extend along the longitudinal and lateral side sections of the interconnect frame, with the second and third sets of base pads extending along the longitudinal and lateral peripheral edge segments of the base substrate. Each of the transposer pads of the second set preferably has a generally spherical configuration, with each of the transposer pads of the first set and each of the frame pads of the first and second sets preferably having a generally semi-spherical configuration.

Each of the integrated circuit chips of the present chip stack preferably comprises a body having opposed, generally planar top and bottom surfaces, and a plurality of conductive contacts disposed on the bottom surface of the body. The conductive contacts of each of the integrated circuit chips are electrically connected to respective ones of the base pads of the first set of a respective one of the first conductive patterns. The transposer pads of the second set, the base pads of the first set, and the conductive contacts are themselves preferably arranged in identical patterns. The chip stack further preferably comprises a layer of flux/underfill (also referred to as a "no flow-fluxing underfill") disposed between the bottom surface of the body of each of the integrated circuit chips and respective ones of the top surfaces of the base substrates. Each layer of flux/underfill is preferably spread over the base pads of the first set of a respective one of the first conductive patterns. The body of each of the integrated circuit chips and the interconnect frame are preferably sized relative to each other such that the top surface of the body of the integrated circuit chip electrically connected to the lower base panel and at least partially circumvented by the interconnect frame does not protrude beyond the top surface thereof. The integrated circuit chips are preferably selected from the group consisting of a BGA device, a fine pitch BGA device, a CSP device, and a flip chip device. Further, the transposer and base substrates are each preferably fabricated from a polyamide or other suitable circuit board material which may be as thin as about 0.010 inches.

Those of ordinary skill in the art will recognize that a chip stack of the present invention may be assembled to include more than two base layers, more than one interconnect frame, and more than two integrated circuit chips. In this respect, a multiplicity of additional interconnect frames, base layers, and integrated circuit chips may be included in the chip stack, with the second conductive pattern of each of the interconnect frames being electrically connected to the first conductive patterns of any adjacent pair of base layers, and each of the integrated circuit chips being electrically connected to the first conductive pattern of a respective one of the base layers.

Further in accordance with the present invention, there is provided a method of assembling a chip stack. The method comprises the initial step of electrically connecting an integrated circuit chip to a first conductive pattern of a base layer. Thereafter, a second conductive pattern of an interconnect frame is electrically connected to the first conductive pattern such that the interconnect frame at least partially circumvents the integrated circuit chip. Another integrated circuit chip is then electrically connected to the first conductive pattern of another base layer. The first conductive pattern of one of the base layers is then electrically connected to the second conductive pattern of the interconnect frame such that one of the integrated circuit chips is disposed between the base layers. The method may further comprise the step of electrically connecting the first conductive pattern of one of the base layers to a third conductive pattern of a transposer layer. In the present assembly method, a layer of flux/underfill is preferably applied to (i.e., spread over) each of the base layers over portions of the first conductive patterns prior to the electrical connection of respective ones of the integrated circuit chips thereto. All of the electrical connections in the present assembly method are preferably accomplished via soldering.

Still further in accordance with the present invention, there is provided a method of assembling a chip stack which comprises the initial steps of providing a transposer panel, at least two base panels, and at least one frame panel which each have opposed surfaces and a plurality of conductive pads disposed on the opposed surfaces thereof. A plurality of integrated circuit chips are also provided which each have opposed sides and include conductive contacts disposed on one of the sides thereof. In this assembly method, integrated circuit chips are placed upon each of the base panels such that the conductive contacts of each of the integrated circuit chips are disposed on at least some of the conductive pads of respective ones of the base panels. Thereafter, one of the base panels is stacked upon the transposer panel such that at least some of the conductive pads of the base panel are disposed on at least some of the conductive pads of the transposer panel. The frame panel is then stacked upon the base panel such that at least some of the conductive pads of the frame panel are disposed on at least some of the conductive pads of the base panel. Another base panel is then stacked upon the frame panel such that at least some of the conductive pads of the base panel are disposed on at least some of the conductive of the frame panel.

The assembly method further comprises bonding the conductive contacts of the integrated circuit chips to at least some of the conductive pads of the base panel upon which the integrated circuit chips are positioned, bonding at least some of the conductive pads of one of the base panels to at least some of the conductive pads of the transposer panel, and bonding at least some of the conductive pads of the frame panel to at least some of the conductive pads of each of the base panels. The assembly method may further comprise the steps of stacking spacer sheets between one of the base panels and the transposer panel, and between the frame panel and each of the base panels. The spacer sheets each have opposed surfaces and a plurality of openings disposed therein. When stacked between the base and transposer panels and between the frame and base panels, the openings of the spacer sheets are aligned with the conductive pads of such panels.

BRIEF DESCRIPTION OF THE DRAWINGS

These, as well as other features of the present invention, will become more apparent upon reference to the drawings wherein:

FIG. 3 is an exploded view of the various components which are stacked upon each other in accordance with a preferred method of assembling the chip stack of the present invention;

FIG. 4 is a partial cross-sectional view of the components shown in FIG. 3 as stacked upon each other prior to a solder reflow step of the present assembly method;

FIG. 4a is an enlargement of the encircled region 4a shown in FIG. 4;

FIG. 5 is partial cross-sectional view similar to FIG. 4 illustrating the components shown in FIG. 3 as stacked upon each other subsequent to the completion of the solder reflow step of the present assembly method; and FIG. 5a is an enlargement of the encircled region 5a shown in FIG. 5.

DETAILED DESCRIPTION OF THE INVENTION

Figures 1, 2:
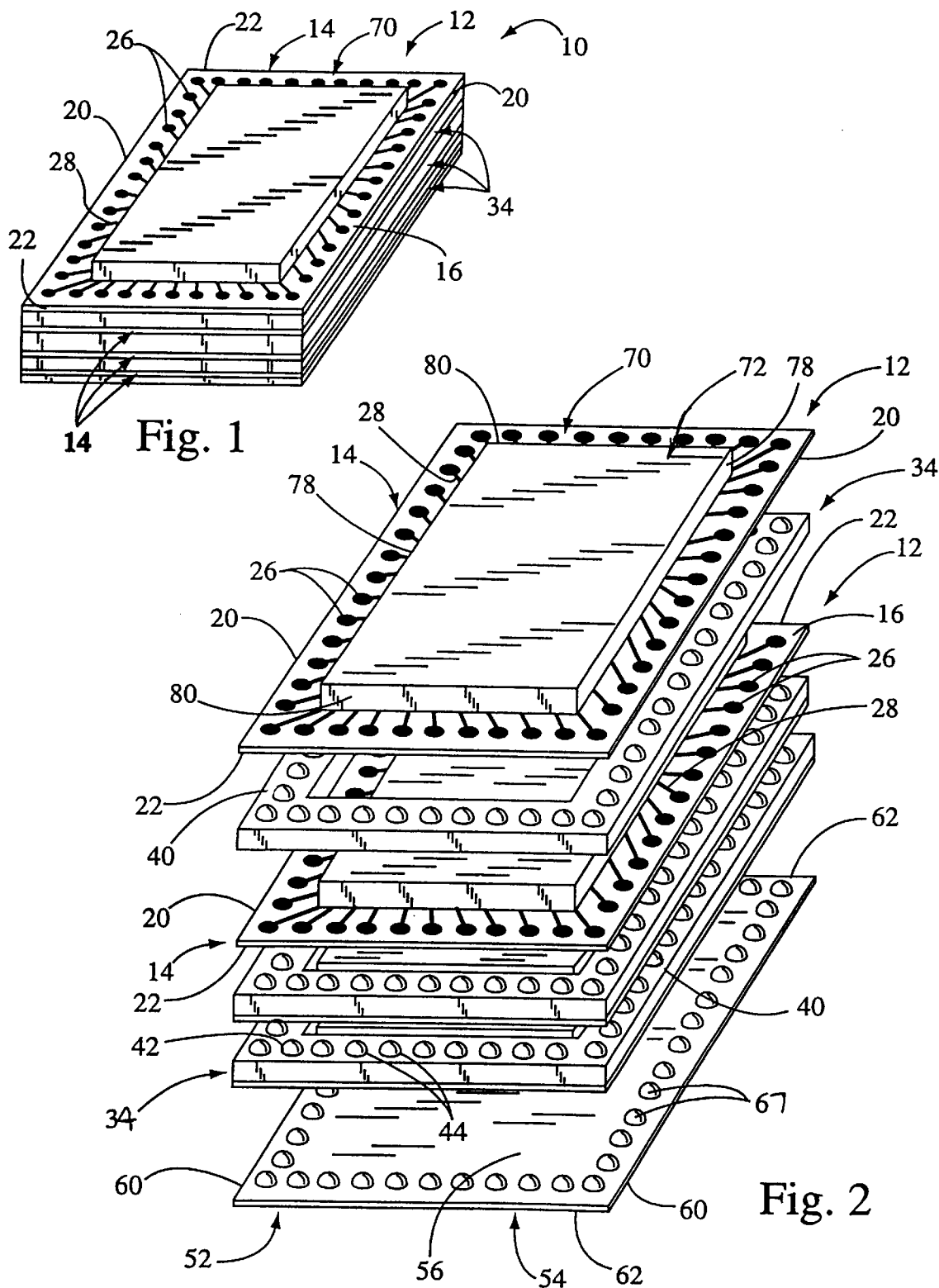
FIG. 1 is a top perspective view of a chip stack constructed in accordance with the present invention.
FIG. 2 is an exploded view of the chip stack shown in FIG. 1.

Referring now to the drawings wherein the showings are for purposes of illustrating a preferred embodiment of the present invention only, and not for purposes of limiting the same, FIG. 1 perspectively illustrates a chip stack 10 assembled in accordance with the present invention. The chip stack 10 comprises at least two identically configured base layers 12. Each of the base layers 12 itself comprises a rectangularly configured base substrate 14 which defines a generally planar top surface 16, a generally planar bottom surface 18, an opposed pair of longitudinal peripheral edge segments 20, and an opposed pair of lateral peripheral edge segments 22.

Disposed on the base substrate 14 of each base layer 12 is a first conductive pattern which itself preferably comprises a first set of base pads 24 and a second set of base pads 26 which are each disposed on the top surface 16 of the base substrate 14. The base pads 24 of the first set are preferably arranged in a generally rectangular pattern or array in the central portion of the base substrate 14, with the base pads 26 of the second set extending linearly along the longitudinal and lateral peripheral edge segments 20, 22 of the base substrate 14. The base pads 24 of the first set are electrically connected to respective ones of the base pads 26 of the second set via conductive traces 28. In addition to the base pads 24, 26 of the first and second sets, the first conductive pattern of each base layer 12 comprises a third set of base pads 30 which is disposed on the bottom surface 18 of the base substrate 14. The base pads 30 of the third set are preferably arranged in an identical pattern to the base pads 26 of the second set, and extend linearly along the longitudinal and lateral peripheral edge segments 20, 22 of the base substrate 14 such that each of the base pads 30 of the third set is aligned with and electrically connected to a respective one of the base pads 26 of the second set.

As is best seen in FIGS. 3–5, each of the base pads 26 of the second set is electrically connected to a respective one of the base pads 30 of the third set via a base feed-through hole 32. Each base feed-through hole 32 is preferably plugged with a conductive material. The conductive material is preferably selected from the group consisting of nickel, gold, tin, silver epoxy, and combinations thereof. The base pads 26, 30 of the second and third sets, as well as the base pads 24 of the first set, each preferably have a generally circular configuration. In this respect, each base feed-through hole 32 preferably extends axially between each corresponding, coaxially aligned pair of the base pads 26, of the second and third sets. The base pads 26, 30 of the second and third sets are preferably formed upon (i.e., surface plated to) the base substrate 14 subsequent to the plugging of the base feed-through holes 32 and are used to cover the opposed, open ends thereof. If the base feed-through holes 32 were left unplugged, solder coming into contact with the base pads 26, 30 of the second and third sets would tend to wick into the base feed-through holes 32 upon the reflow of the solder (which will be discussed below), thus robbing the base pads 26, 30 of solder needed to facilitate various electrical connections in the chip stack 10.

In addition to the base layers 12, the chip stack 10 of the present invention comprises at least one rectangularly configured interconnect frame 34. The interconnect frame 34 defines a generally planar top surface 36, a generally planar bottom surface 38, an opposed pair of longitudinal side sections 40, and an opposed pair of lateral side sections 42. Disposed on the interconnect frame 34 is a second conductive pattern which itself preferably comprises a first set of frame pads 44 disposed on the top surface 36, and a second set of frame pads 46 disposed on the bottom surface 38. The frame pads 44, 46 of the first and second sets are preferably arranged in patterns which are identical to each other, and to the patterns of the second and third sets of base pads 26, 30 of each of the base layers 12. In this respect, the frame pads 44, 46 of the first and second sets each extend linearly along the longitudinal and lateral side sections 40, 42 of the interconnect frame 34, with each of the frame pads 44 of the first set being aligned with and electrically connected to a respective one of the frame pads 46 of the second set. As best seen in FIGS. 4(a) and 5(a), similar to the electrical connection of the base pads 26, 30 of the second and third sets to each other, the electrical connection of each of the frame pads 44 of the first set to a respective one of the frame pads 46 of the second set is preferably accomplished via a frame feed-through hole 48 which is also preferably plugged with a conductive material. The conductive material is preferably selected from the same group used as the conductive material to plug the base feed-through holes 32, i.e., nickel, gold, tin, silver epoxy, and combinations thereof. Each of the frame feed-through holes 48 preferably extends axially between a corresponding, coaxially aligned pair of the frame pads 44, 46 of the first and second sets, with the plugging of the frame feed-through holes 48 preferably occurring prior to the surface plating of the frame pads 44, 46 of the first and second sets to respective ones of the top and bottom surfaces 36, 38 of the interconnect frame 34.

In the preferred embodiment, the interconnect frame 34 is preferably prepared for use in the chip stack 10 by forming generally semi-spherically shaped solder bumps 50 on each of the frame pads 44, 46 of the first and second sets. These solder bumps 50 are preferably formed by first stenciling solder paste onto the frame pads 44, 46 of the first and second sets, and thereafter reflowing the solder paste to form the solder bumps 50. The use of a six mil thick stencil with an aperture approximately the same size as each of the frame pads 44, 46 will facilitate the formation of a solder bump 50 approximately six mils high. As indicated above, the frame pads 44, 46 of the first and second sets are formed (i.e., surface plated) subsequent to the frame feed-through holes 48 being plugged with the conductive material. If the frame feed-through holes 48 were left unplugged, each frame feed-through hole 48 could trap flux or air which would blow out the solder during the reflow cycle used to form the solder bumps 50 on each corresponding, coaxially aligned pair of frame pads 44, 46 of the first and second sets.

In the chip stack 10, the interconnect frame 34 is disposed between the base layers 12, with the second conductive pattern of the interconnect frame 34 being electrically connected to the first conductive pattern of each of the base layers 12. More particularly, the frame pads 46 of the second set are electrically connected to respective ones of the base pads 26 of the second set of one of the base layers 12 (i.e., the base layer 12 immediately below the interconnect frame 34 in the chip stack 10), with the frame pads 44 of the first set being electrically connected to respective ones of the base pads of the third set of one of the base layers 12 (i.e., the base layer 12 immediately above the interconnect frame 34 in the chip stack 10). Due to the base pads 26, 30 of the second and third sets and the frame pads 44, 46 of the first and second sets all being arranged in identical patterns, each coaxially aligned pair of frame pads 44, 46 of the first and second sets is itself coaxially aligned with a coaxially aligned set of base pads 26, 30 of the second and third sets of each of the adjacent base layers 12. The electrical connection of the second conductive pattern of the interconnect frame 34 to the first conductive pattern of each of the adjacent base layers 12 is preferably facilitated via a soldering process which will be described in more detail below.

The chip stack 10 of the present invention further preferably comprises a transposer layer 52. The transposer layer 52 itself comprises a rectangularly configured transposer substrate 54 which defines a generally planar top surface 56, a generally planar bottom surface 58, an opposed pair of longitudinal peripheral edge segments 60, and an opposed pair of lateral peripheral edge segments 62. Disposed on the transposer substrate 54 is a third conductive pattern. The third conductive pattern comprises a first set of transposer pads 64 which are disposed on the top surface 56 of the transposer substrate 54, and a second set of transposer pads 66 which are disposed on the bottom surface 58 thereof. The transposer pads 64 of the first set are electrically connected to respective ones of the transposer pads 66 of the second set via conductive traces. The transposer pads 64 of the first set are preferably arranged in a pattern which is identical to the patterns of the second and third sets of base pads 26, 30 and the first and second sets of frame pads 44, 46. In this respect, the transposer pads 64 of the first set extend linearly along the longitudinal and lateral peripheral edge segments 60, 62 of the transposer substrate 54. The transposer pads 66 of the second set are themselves preferably arranged in a generally rectangular pattern or array in the central portion of the bottom surface 58 of the transposer substrate 54, with the pattern of the transposer pads 66 of the second set preferably being identical to the pattern of the base pads 24 of the first set of each of the base layers 12.

In the preferred embodiment, the transposer layer 52 is prepared for use in the chip stack 10 by forming generally spherically shaped solder balls 68 on each of the transposer pads 66 of the second set. These solder balls 68 are preferably formed by stencil printing solder paste onto each of the transposer pads 66 of the second set, and thereafter reflowing the solder paste to form the solder balls 68. The aperture in the stencil used to form the solder balls 68 is typically larger than each of the transposer pads 66 and thick enough to deposit sufficient solder to form the solder balls 68. As seen in FIG. 3, the transposer layer 52 is also prepared for use in the chip stack 10 by forming generally semi-spherically shaped solder bumps 67 on each of the transposer pads 64 of the first set. These solder bumps 67 are preferably formed in the same manner previously described in relation to the formation of the solder bumps 50 on the frame pads 44, 46 of the first and second sets.

In the chip stack 10, the first conductive pattern of one of the base layers 12 (i.e., the lowermost base layer 12 in the chip stack 10) is electrically connected to the third conductive pattern of the transposer layer 52. More particularly, each of the base pads 30 of the third set of the lowermost base layer 12 is electrically connected to a respective one of the transposer pads 64 of the first set. Due to the base pads 30 of the third set and the transposer pads 64 of the first set being arranged in identical patterns, each of the base pads 30 of third set is coaxially alignable with a respective one of the transposer pads 64 of the first set, with the electrical connection therebetween preferably being facilitated via soldering as will be discussed in more detail below.

In the present chip stack 10, the base pads 24, 26, 30 of the first, second and third sets, the conductive traces 28, the frame pads 44, 46 of the first and second sets, and the transposer pads 64, 66 of the first and second sets are each preferably fabricated from very thin copper having a thickness in the range of from about five microns to about twenty-five microns through the use of conventional etching techniques. Advantageously, the use of thin copper for the various pads and traces 28 allows for etching line widths and spacings down to a pitch of about 4 mils which substantially increases the routing density on each of the base layers 12, as well as the transposer layer 52. Additionally, the base substrate 14, the interconnect frame 34, and the transposer substrate 54 are each preferably fabricated from either FR-4, polyamide, or some other suitable material which can easily be routed. As indicated above, all of the base feed-through holes 32 and frame feed-through holes 48 are plugged with a conductive material prior to the surface plating procedure used to form the base pads 24, 26, 30 of the first, second and third sets, and the frame pads 44, 46 of the first and second sets. The material used to form each base substrate 14 and/or the transposer substrate 54 may be as thin as about 0.010 inches or may be a thicker multilayer structure.

The chip stack 10 of the present invention further comprises at least two identically configured integrated circuit chips 70 which are electrically connected to respective ones of the first conductive patterns of the base layers 12. Each of the integrated circuit chips 70 preferably comprises a rectangularly configured body 72 defining a generally planar top surface 74, a generally planar bottom surface 76, an opposed pair of longitudinal sides 78, and an opposed pair of lateral sides 80. Disposed on the bottom surface 76 of the body 72 are a plurality of generally spherically shaped conductive contacts 82 which are preferably arranged in a pattern identical to the patterns of the base pads 24 of the first set and the transposer pads 66 of the second set. The conductive contacts 82 of each of the integrated circuit chips 70 are electrically connected to respective ones of the base pads 24 of the first set of a respective one of the first conductive patterns of the base layers 12. Due to the conductive contacts 82 and base pads 24 of each of the first sets being arranged in identical patterns, the conductive contacts 82 of each of the integrated circuit chips 70 are coaxially alignable with respective ones of the base pads 24 of the corresponding first set. In each of the integrated circuit chips 70, solder is preferably pre-applied to each of the conductive contacts 82 thereof. The electrical connection of the conductive contacts 82 of each integrated circuit chip 70 to respective ones of the base pads 24 of the first set of a respective one of the first conductive patterns is preferably accomplished via soldering in a manner which will be discussed in more detail below. Additionally, each of the integrated circuit chips 70 is preferably a BGA (ball grid array) device, though the same may alternatively comprise either a CSP device or a flip chip device.

In the present chip stack 10, a layer 84 of flux/underfill is preferably disposed between the bottom surface 76 of the body 72 of each of the integrated circuit chips 70 and respective ones of the top surfaces 16 of the base substrates 14. Each layer 84 of the flux/underfill is preferably spread over the base pads 24 of the first set of a respective one of the first conductive patterns of the base layers 12. Each layer 84 substantially encapsulates the conductive contacts 82 of the corresponding integrated circuit chip 70 when the same is electrically connected to the first conductive pattern of a respective one of the base layers 12.

Prior to the attachment of the integrated circuit chip 70 to a respective base layer 12, a bakeout cycle is required to drive out the moisture in the base layer 12 and the corresponding integrated circuit chip 70. A cycle of approximately eight hours at about 125° Celsius is desirable, which is followed by storage in a dry nitrogen atmosphere until use. The first step in the attachment of the integrated circuit chip 70 to the corresponding base layer 12 is the precise deposition of the layer 84 of an appropriate flux/underfill material over the base pads 24 of the corresponding first set. The integrated circuit chip 70 is then placed over the pad area, squeezing out the flux/underfill material of the layer 84 to the longitudinal and lateral sides 78, 80 of the body 72 and seating the conductive contacts 82 onto respective ones of the base pads 24 of the corresponding first set. If done properly, the layer 84 of the flux/underfill material, when cured, will have no voids or minimum voids. The base layer 12 having the integrated circuit chip 70 positioned thereupon in the above-described manner is then run through a solder reflow cycle with no dwelling time at an intermediate temperature of approximately 150° Celsius. A post cure cycle to complete the polymerization of the layer 84 of the flux/underfill material may be required depending on the particular flux/underfill material used in the layer 84. At this juncture, the base layer 12 having the integrated circuit chip 70 electrically connected thereto may be electrically tested.

In the prior art, the standard approach for the attachment or electrical connection of the conductive contacts of a BGA device to an attachment or pad site is to first flux the pad site or conductive contacts of the BGA device, place the BGA device on the pad site in the proper orientation, reflow the solder pre-applied to the conductive contacts of the BGA device to facilitate the electrical connection to the pad site, clean, then underfill and cure. The cleaning step typically requires considerable time since the gap under the bottom surface of the body of the BGA device is very small and very difficult to penetrate with standard cleaning methods. Also, the removal of the cleaning fluid (which is generally water) requires long bakeout times.

The underfill of an epoxy between the bottom surface of the body of the BGA device and the top surface of the substrate having the pad site thereon is a relatively easy procedure, but is very slow. If a no-clean flux is used for attachment, the residue from the flux typically becomes entrapped within the epoxy underfill and may cause corrosion problems. A subsequent solder reflow process to facilitate the attachment of the chip stack to a main printed circuit board (PCB) often causes the residue flux to vaporize which exerts pressure on the solder joints and could delaminate the structure. Most underfill materials become very hard (i.e., greater than ninety shore D) and are cured at a temperature of less than about 180° Celsius. The solder is solid at this temperature and the underfill encases the solder with no room for expansion. The solder from the conductive contacts of the BGA device expands when molten again, thus exerting pressure which can delaminate the structure. If the chip stack is not subjected to subsequent reflow temperatures when completed, there is no problem. However, the chip stack must be able to withstand the subsequent reflow temperature.

The flux/underfill material used for the layer 84 provides both flux and underfill properties with one formulation. As the temperature rises during the solder reflow process which will be discussed below, the flux characteristics of the material aid in the solder process, with extended exposure to the peak solder reflow temperature beginning the polymerization process of the underfill portion of the material. The flux is incorporated into the underfill, thus becoming one compatible material which is cured above the melting point of solder. Thus, there is room within the encased solder for expansion at the reflow temperature. No cleaning steps are required, though careful dispensing of the correct volume and accurate placement of the integrated circuit chip 70 upon its corresponding base layer 12 is critical.

The complete chip stack 10 shown in FIG. 1 includes a transposer layer 52, four base layers 12, three interconnect frames 34, and four integrated circuit chips 70. The first conductive pattern of the lowermost base layer 12 is electrically connected to the third conductive pattern of the transposer layer 52 in the above-described manner. Additionally, each of the interconnect frames 34 is disposed or positioned between an adjacent pair of base layers 12, with the second conductive pattern of each of the interconnect frames 34 being electrically connected to the first conductive pattern of such adjacent pair of base layers 12 in the above-described manner. Since the conductive contacts 82 of each of the integrated circuit chips 70 are electrically connected to respective ones of the base pads 24 of the first set of respective ones of the first conductive patterns, the integrated circuit chips 70 other than for the uppermost integrated circuit chip 70 are disposed between adjacent pairs of the base layers 12 and are each circumvented by a respective one of the interconnect frames 34. Thus, the bodies 72 of the integrated circuit chips 70 and the interconnect frames 34 are preferably sized relative to each other such that the top surface 74 of the body 72 of an integrated circuit chip 70 which is circumvented by an interconnect frame 34 does not protrude beyond the top surface 36 thereof.

As also indicated above, all the various electrical connections within the chip stack 10 are preferably facilitated via soldering. The transposer pads 66 of the second set, which are spherically shaped as indicated above, form a ball grid array on the bottom of the chip stack 10 which is specifically suited for facilitating the attachment of the chip stack 10 to a printed circuit board (PCB). Those of ordinary skill in the art will recognize that the chip stack 10 may be assembled to include fewer or greater than four base layers 12, three interconnect frames 34, and four integrated circuit chips 70.

Having thus described the structural attributes of the chip stack 10, the preferred method of assembling the same will now be described with specific reference to FIGS. 3, 4, 4(*a*), 5 and 5(*a*). In accordance with the present invention, multiple chip stacks 10 may be concurrently assembled through the use of a transposer panel 86, at least two base panels 88, at least one frame panel 90, at least three spacer-sheets 92, and a plurality of integrated circuit chips 70. The transposer panel 86 is formed to include multiple groups of the first and second sets of transposer pads 64, 66 with such groups being formed on the transposer panel 86 in spaced relation to each other. Similarly, each of the base panels 88 is formed to include multiple groups of the first, second and third sets of base pads 24, 26, 30, with the frame panels 90 each being formed to include multiple groups of the first and second sets of frame pads 44, 46. As indicated above, the transposer panel 86 is prepared such that the transposer pads 64 of the first set of each group have the solder bumps 67 formed thereon, with the transposer pads 66 of the second set of each group having the solder balls 68 formed thereon. Similarly, each of the frame panels 90 is prepared such that the first and second sets of frame pads 44, 46 of each group have the solder bumps 50 formed thereon. The spacer sheets 92 are each formed to define a plurality of rectangularly configured openings 94, the length and width dimensions of which exceed those of the base and transposer substrates 14, 54 and interconnect frames 34 which are substantially equal to each other.

In a preferred assembly process, the integrated circuit chips 70 are electrically connected to respective ones of each of the first sets of base pads 24 included on each of the base panels 88. Such electrical connection is accomplished in the above-described manner. Subsequent to the pre-attachment of the integrated circuit chips 70 to the base panels 88, flux/underfill material is dispensed onto each of the solder bumps 67 of the transposer panel 86, with the flux/underfill material also being dispensed onto all of the solder bumps 50 of each of the frame panels 90. The transposer panel is then cooperatively engaged to a stacking fixture such that the solder balls 68 face or are directed downwardly. A spacer sheet 92 is then stacked upon the transposer panel 86 such that the transposer pads 64 of the first set of each group are aligned with respective ones of the openings 94 within the spacer sheet 92. A base panel 88 is then stacked upon the spacer sheet 92 such that the base pads 30 of the third set of each group face or are directed downwardly and are aligned with respective ones of the openings 94 and respective ones of the transposer pads 64 of the first set of the corresponding group upon the transposer panel 86 immediately therebelow. Another spacer sheet 92 is then stacked upon the base panel 88 such that the base pads 24, 26 of the first and second sets of each group are aligned with respective ones of the openings 94.

In the next step of the assembly process, a frame panel 90 is stacked upon the uppermost spacer sheet 92 such that the bodies 72 of the integrated circuit chips 70 are each circumvented by the frame panel 90. Another spacer sheet 92 is then stacked upon the frame panel 90 such that the frame pads 44 of the first set of each group are aligned with respective ones of the openings 94. Another base panel 88 is then stacked upon the uppermost spacer sheet 92 in a manner wherein the base pads 30 of the third set of each group of such uppermost base panel 88 are aligned with respective ones of the openings 94 and respective ones of the frame pads 44 of the first set of the corresponding group upon the frame panel 90 immediately therebelow. As will be recognized, the above-described stacking process may be continued or repeated to form a chip stack having a greater number of electrically interconnected integrated circuit chips 70.

Upon the stacking of the various panels and sheets in the above-described manner, a pressure plate is applied to the top of the stack to maintain such panels and sheets in prescribed orientations relative to each other. The stacked panels and sheets are then subjected to heat at a level sufficient to facilitate the reflow of the solder bumps 50, 67. The solder reflow cycle is typically conducted in a temperature range of from about 215° Celsius to about 250° Celsius. Upon the completion of solder reflow process, the individual chip stacks are separated through the use of a router.

In the preferred assembly method as discussed above, the spacer sheets 92 are needed only for the solder reflow process, and do not become part of each resultant chip stack formed by the completion of the routing process. The solder bumps 50, 67 are slightly higher than each spacer sheet 92. Since light pressure is applied to the various panels and sheets during the solder reflow process, the solder bumps 50, 67 collapse, thus making the appropriate electrical connections to the corresponding pads (i.e., the base pads 26, 30 of either the second or third sets). Thus, the spacer sheets 92 keep the solder from being squeezed out and bridging to neighboring pads. A spacing of from about four mils to about six mils can be accomplished using spacer sheets 92 which are fabricated from paper. The paper can be easily punched to form the openings 94, does not interfere with the routing process, can withstand the solder reflow temperature in the aforementioned range, and is inexpensive. The paper spacer sheets 92 would be sized the same as the transposer, base and frame panels 86, 88, 90, and punched to include openings 94 which are slightly larger than the finished, routed chip stack. With slight pressure being applied to the stacked panels and sheets, the space between the panels and sheets is easily maintained, thus eliminating the necessity to remove the spacer sheets 92 subsequent to the reflow of the solder. As indicated above, the paper spacer sheets 92 would not interfere with the routing process, and would be removed with the rest of the debris.

The present assembly method has high volume potential, with the use of the flux/underfill material providing localized encapsulation of the conductive contacts 82 of the integrated circuit chips 70 and eliminating the need for a cleaning cycle as discussed above. Those of ordinary skill in the art will recognize that a transposer panel 86 need not necessarily be included in the assembly process, since the lowermost base layer 12 in any chip stack may be used as a transposer board to facilitate the mounting or electrical connection of the chip stack to a PCB. In the completed chip stack, the solder joints between each of the integrated circuit chips 70 and the corresponding base layer 12 are protected by the flux/underfill material.

Additional modifications and improvements of the present invention may also be apparent to those of ordinary skill in the art. Thus, the particular combination of parts and steps described and illustrated herein is intended to represent only one embodiment of the present invention, and is not intended to serve as limitations of alternative devices and methods within the spirit and scope of the invention.

What is claimed is:

1. A method of assembling a chip stack, comprising the steps of:

(a) providing a transposer panel which has opposed surfaces and a plurality of conductive pads disposed on the opposed surfaces thereof;

(b) providing at least two base panels which each have opposed surfaces and a plurality of conductive pads disposed on the opposed surfaces thereof;

(c) providing at least one unitary frame panel which has opposed surfaces and a plurality of conductive pads disposed on the opposed surfaces thereof;

(d) providing a plurality of integrated circuit chips which each have opposed sides and a plurality of conductive contacts disposed on one of the sides thereof;

(e) placing integrated circuit chips upon each of the base panels such that the conductive contacts of each of the integrated circuit chips are disposed on at least some of the conductive pads of respective ones of the base panels;

(f) stacking one of the base panels upon the transposer panel such that at least some of the conductive pads of the base panel are disposed on at least some of the conductive pads of the transposer panel;

(g) stacking the frame panel upon the base panel such that at least some of the conductive pads of the frame panel are disposed on at least some of the conductive pads of the base panel and such that the frame panel at least partially circumvents the integrated circuit chips; and (h) stacking another base panel upon the frame panel such that at least some of the conductive pads of the base panel are disposed on at least some of the conductive pads of the frame panel.

2. The method of claim 1 wherein steps (g) and (h) are repeated at least once subsequent to step (h).

3. The method of claim 1 further comprising the step of:

(i) electrically connecting the conductive contacts of the integrated circuit chips to at least some of the conductive pads of the base panel upon which the integrated circuit chips are positioned, electrically connecting at least some of the conductive pads of one of the base panels to at least some of the conductive pads of the transposer panel, and electrically connecting at least some of the conductive pads of the frame panel to at least some of the conductive pads of each of the base panels.

4. A method of assembling a chip stack, comprising the steps of:

(a) providing a transposer panel which has opposed surfaces and a plurality of conductive pads disposed on the opposed surfaces thereof;

(b) providing at least two base panels which each have opposed surfaces and a plurality of conductive pads disposed on the opposed surfaces thereof;

(c) providing at least one frame panel which has opposed surfaces and a plurality of conductive pads disposed on the opposed surfaces thereof;

(d) providing a plurality of integrated circuit chips which each have opposed sides and a plurality of conductive contacts disposed on one of the sides thereof;

(e) placing integrated circuit chips upon each of the base panels such that the conductive contacts of each of the integrated circuit chips are disposed on at least some of the conductive pads of respective ones of the base panels;

(f) stacking a first spacer sheet upon the transposer panel and stacking the base panel upon the first spacer sheet such that the conductive pads of the transposer and base panels are aligned with respective ones of the openings and such that at least some of the conductive pads of the base panel are disposed on at least some of the conductive pads of the transposer panel;

(g) stacking a second spacer sheet upon the base panel and stacking the frame panel upon the second spacer sheet such that the conductive pads of the base and frame panels are aligned with respective ones of the openings and such that at least some of the conductive pads of the frame panel are disposed on at least some of the conductive pads of the base panel; and (h) stacking a third spacer sheet upon the frame panel and stacking the base panel upon the third spacer sheet such that the conductive pads of the frame and base panels are aligned with respective ones of the openings.

5. A method of assembling a chip stack, comprising the steps of:

(a) providing at least two base panels which each have opposed surfaces and a plurality of conductive pads disposed on the opposed surfaces thereof;

(b) providing at least one unitary frame panel which has opposed surfaces and a plurality of conductive pads disposed on the opposed surfaces thereof;

(c) providing a plurality of integrated circuit chips which each have opposed sides and a plurality of conductive contacts disposed on one of the sides thereof;

(d) placing integrated circuit chips upon each of the base panels such that the conductive contacts of each of the integrated circuit chips are disposed on at least some of the conductive pads of respective ones of the base panels;

(e) stacking one frame panel upon one of the base panels such that at least some of the conductive pads of the frame panel are disposed on at least some of the conductive pads of the base panel and such that the frame panel at least partially circumvents the integrated circuit chips; and (f) stacking another base panel upon the frame panel such that at least some of the conductive pads of the base panel are disposed on at least some of the conductive pads of the frame panel.

6. The method of claim 5 wherein steps (e) and (f) are repeated at least once subsequent to step (f).

7. The method of claim 5 further comprising the step of:

(g) electrically connecting the conductive contacts of the integrated circuit chips to at least some of the conductive pads of the base panel upon which the integrated circuit chips are positioned, and electrically connecting at least some of the conductive pads of the frame panel to at least some of the conductive pads of each of the base panels.

8. A method of assembling a chip stack, comprising the steps of:

(a) providing at least two base panels which each have opposed surfaces and a plurality of conductive pads disposed on the opposed surfaces thereof;

(b) providing at least one frame panel which has opposed surfaces and a plurality of conductive pads disposed on the opposed surfaces thereof;

(c) providing a plurality of integrated circuit chips which each have opposed sides and a plurality of conductive contacts disposed on one of the sides thereof;

(d) placing integrated circuit chips upon each of the base panels such that the conductive contacts of each of the integrated circuit chips are disposed on at least some of the conductive pads of respective ones of the base panels;

(e) stacking a first spacer sheet upon the base panel and stacking the frame panel upon the first spacer sheet such that the conductive pads of the base and frame panels are aligned with respective ones of the openings and such that at least some of the conductive pads of the frame panel are disposed on at least some of the conductive pads of the base panel; and (f) stacking a second spacer sheet upon the frame panel and stacking the base panel upon the second spacer sheet such that the conductive pads of the frame and base panels are aligned with respective ones of the openings and such that at least some of the conductive pads of the base panel are disposed on at least some of the conductive pads of the frame panel.

* * * * *